(12) United States Patent
Mason

(10) Patent No.: US 7,150,653 B1
(45) Date of Patent: Dec. 19, 2006

(54) TECHNIQUES FOR EMI SHIELDING OF A TRANSCEIVER MODULE

(75) Inventor: Todd Mason, Livermore, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/231,475

(22) Filed: Sep. 21, 2005

(51) Int. Cl.
*H01R 13/648* (2006.01)

(52) U.S. Cl. ............ 439/609; 439/607; 439/939; 385/92

(58) Field of Classification Search ........ 439/607–610, 439/939; 385/92
See application file for complete search history.

(56) References Cited

U.S. PATENT DOCUMENTS

| | | | | |
|---|---|---|---|---|
| 6,005,186 | A * | 12/1999 | Bachman ................ | 174/35 R |
| 6,066,001 | A * | 5/2000 | Liptak et al. ............ | 439/607 |
| 6,095,862 | A * | 8/2000 | Doye et al. .............. | 439/607 |
| 6,478,622 | B1 * | 11/2002 | Hwang .................... | 439/607 |
| 6,607,308 | B1 * | 8/2003 | Dair et al. ............... | 385/92 |
| 6,709,286 | B1 * | 3/2004 | Korsunsky et al. ...... | 439/557 |
| 6,749,448 | B1 | 6/2004 | Bright et al. ............ | 439/160 |
| 6,752,663 | B1 * | 6/2004 | Bright et al. ............ | 439/607 |
| 6,816,376 | B1 | 11/2004 | Bright et al. ............ | 361/704 |
| 6,866,544 | B1 | 3/2005 | Casey et al. ............. | 439/607 |
| 6,893,293 | B1 | 5/2005 | Ice et al. ................. | 439/607 |
| 6,943,287 | B1 * | 9/2005 | Lloyd et al. ............. | 174/35 GC |
| 6,951,426 | B1 | 10/2005 | Weber ..................... | 385/88 |
| 6,980,437 | B1 | 12/2005 | Bright ..................... | 361/704 |
| 7,001,217 | B1 | 2/2006 | Bright et al. ............ | 439/609 |

* cited by examiner

*Primary Examiner*—Gary F. Paumen
(74) *Attorney, Agent, or Firm*—BainwoodHuang

(57) ABSTRACT

An apparatus is configured to contain a transceiver module. The apparatus includes a support member defining a space to receive the transceiver module. The support member has a front portion which forms a front of the support member and a mounting portion which is configured to physically and electrically connect with a circuit board. The apparatus further includes a face plate which attaches to the front portion of the support member. The face plate defines an opening through which the transceiver module passes when the transceiver module enters and exits the space. The apparatus further includes an electromagnetic interference shielding clip which installs around the face plate. The electromagnetic interference shielding clip includes four side portions which define hinges along mid-lines of the side portions. Actuation of the hinges enables the electromagnetic interference shielding clip to conveniently and easily install around the face plate.

21 Claims, 4 Drawing Sheets

TECHNIQUES FOR EMI SHIELDING OF A TRANSCEIVER MODULE

BACKGROUND

The components which are involved in connecting a small form factor pluggable (XFP) optical transceiver module to a host board typically include, among other things, a cage assembly, a bezel, and a bezel electromagnetic interference (EMI) gasket. The cage assembly typically includes press-fit pins which insert into plated through holes of the host board (PCB). The bezel fastens directly to the host board and operates as a structural support of sufficient mechanical strength to facilitate insertion and extraction of the transceiver module through the front of the cage assembly. The bezel EMI gasket resides between the bezel and the front of the cage assembly to provide an EMI seal therebetween.

One conventional EMI gasket is formed by a shallow rectangular metallic frame which mirrors a periphery of a front flange of the cage assembly, and four clasps in the four corners of the shallow rectangular metallic frame. During installation, the frame moves toward the front flange and the clasps snap over open corners of the front flange and thus holding the frame to the front flange.

In accordance with a standard established by the Multi Source Agreement (MSA) Group, the preferred method for fastening the bezel EMI gasket is to fasten the gasket to the back of the bezel with a pressure sensitive adhesive. This preferred method is described in a document entitled "INF-8077i—10 Gigabit Small Form Factor Pluggable Module", SFF Committee, Revision 4.0, Apr. 13, 2004, the teachings of which are hereby incorporated by reference in their entirety.

SUMMARY

Unfortunately, EMI leakage between the cage assembly and the bezel poses a significant reliability issue. In particular, XFP transceiver modules emit large amounts of EMI and if the EMI emissions are not kept to an acceptable level (e.g., as set by external agencies such as NEB, UL, etc.), the products containing the offending modules will cause malfunctions within their parent systems and/or other systems in the vicinity. Moreover, if such a system fails emissions testing, the system may not be qualified for use customer facilities.

In contrast to the above-described conventional bezel EMI gaskets for XFP transceiver modules, an electromagnetic interference shielding clip includes side portions which define hinges along mid-lines of the side portions. Actuation of the hinges enables the clip to easily install around a face plate of a transceiver cage assembly while still allowing the clip to be proportionally larger, and enables the clip to provide addition EMI contact surface (e.g., four additional EMI contact members) than the above-described conventional bezel EMI gaskets. As a result, the EMI shielding properties of such a clip are substantially superior to the above-described conventional bezel EMI gaskets. Furthermore, the hinged design allows simple fabrication using standard brake tooling.

One embodiment is directed to an apparatus for containing a transceiver module. The apparatus includes a support member defining a space to receive the transceiver module. The support member has a front portion which forms a front of the support member and a mounting portion which is configured to physically and electrically connect with a circuit board. The apparatus further includes a face plate which attaches to the front portion of the support member. The face plate defines an opening through which the transceiver module passes when the transceiver module enters and exits the space. The apparatus further includes an electromagnetic interference shielding clip which installs around the face plate. The electromagnetic interference shielding clip includes four side portions which define hinges along mid-lines of the side portions. Actuation of the hinges enables the electromagnetic interference shielding clip to conveniently and easily install around the face plate.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

An electromagnetic interference shielding clip includes side portions which define hinges along mid-lines of the side portions. Actuation of the hinges enables the clip to easily install around a face plate of a transceiver cage assembly while still allowing the clip to be proportionally larger than conventional bezel EMI gaskets for XFP transceiver modules. As a result, the EMI shielding properties of such a clip are substantially superior to conventional bezel EMI gaskets. Furthermore, the hinged design allows simple fabrication using standard brake tooling.

Figure 1:
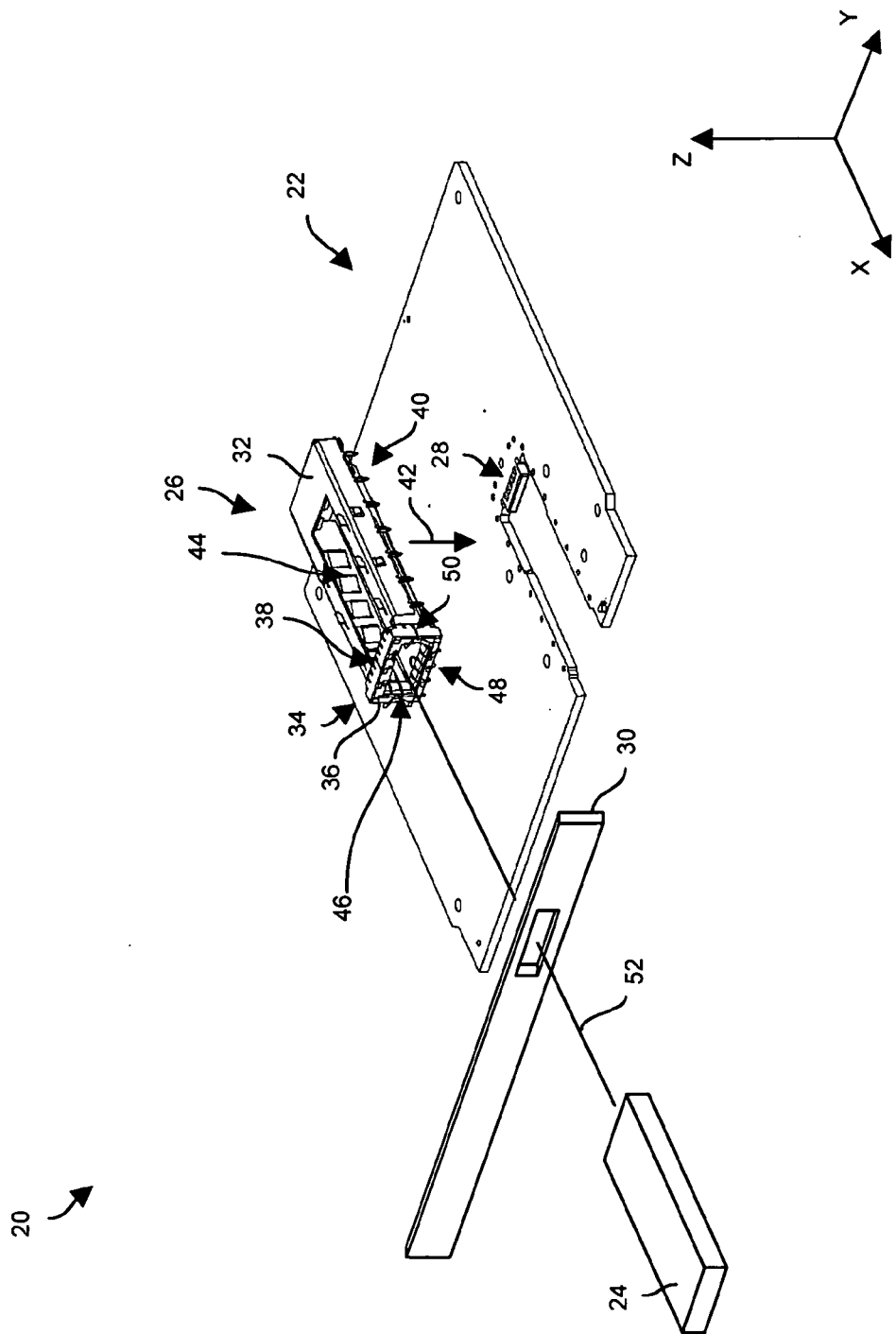
FIG. 1 is a partially exploded view of a circuit board assembly which utilizes an improved apparatus for containing a transceiver module.

FIG. 1 is a partially exploded view of a circuit board assembly 20 with improved EMI shielding. The circuit board assembly 20 includes a circuit board 22, a transceiver module 24 and an apparatus 26 configured to mount to the circuit board 22 and contain the transceiver module 24. The circuit board 22 extends along the X-Y plane and includes a variety of circuit board components such as a transceiver connector 28 and a bezel 30 among other devices (e.g., an optical transceiver chipset). The transceiver connector 28 is configured to connect the transceiver module 24 to conductors within the circuit board 22 (e.g., signal traces, ground and power planes, etc.). The bezel 30 is configured to provide mechanical strength and thus operate as a support surface for connection and disconnection of the transceiver module 24.

By way of example, the transceiver module 24 is a small form factor pluggable (XFP) optical transceiver device, and the apparatus 26 is a XFP cage assembly which is adapted to support and retain the XFP optical transceiver device in accordance with the Multi Source Agreement. However, it should be understood that other types of modules and devices, and their associated configurations are suitable for use in the system 20 as well such as XENPAK, X2, and so on.

As shown in FIG. 1, the apparatus 26 includes a support member 32 (e.g., a metallic cage assembly), a face plate 34 and an EMI shielding clip 36. The support member 32 includes a front portion 38 which forms a front of the support member 32 and a mounting portion 40 which physically and electrically connects with the circuit board 22 when moved toward the circuit board 22 in the direction 42. Although a press-fit pin configuration is shown (e.g., eye-of-the-needle-style pins), other mounting techniques are suitable for use as well (e.g., pin-in-hole soldering, surface mount technology, etc.).

As further shown in FIG. 1, the support member 32 defines a space 44 to contain both the transceiver connector 28 and the transceiver module 24. The face plate 34 attaches to the front portion 38 of the support member 28, and defines an opening 46 through which the transceiver module 24 passes when the transceiver module 24 enters and exits the space 44. The EMI shielding clip 36 installs around the face plate 34. In particular, the EMI shielding clip 36 includes four side portions 48 which define hinges 50 along mid-lines of the side portions 48. As will be further explained shortly, actuation of the hinges 50 enables the EMI shielding clip 36 to easily install around the face plate 34 without damaging or permanently deforming the EMI shielding clip 36.

When the apparatus 26 is properly mounted to the circuit board 22 and when the transceiver module 24 installs within the space 44 via insertion along an insertion axis 52 (e.g., the negative X-direction in FIG. 1), the apparatus 26 in combination with the bezel 30 is configured to operate as a Faraday cage to block escape of EMI emanating from the transceiver module 24. In particular, the EMI shielding clip 36 is configured to provide an exceptional grounding path from the transceiver module 24 to the bezel 30 and to the face plate 34 which are grounded to the ground plane of the circuit board 22. Additionally, the EMI shielding clip 36 robustly seals any gap between the cage assembly 26 and the face plate 34 to prevent EMI leakage between the cage assembly 26 and the face plate 34 even in situations of high tolerance stack-up. That is, metallic material of the EMI shielding clip 36 enables the clip 36 to operate as a robust EMI gasket and block EMI emissions from escaping between the bezel 30 and the support member 32. Further details will now be provided with reference to FIG. 2.

Figure 2:
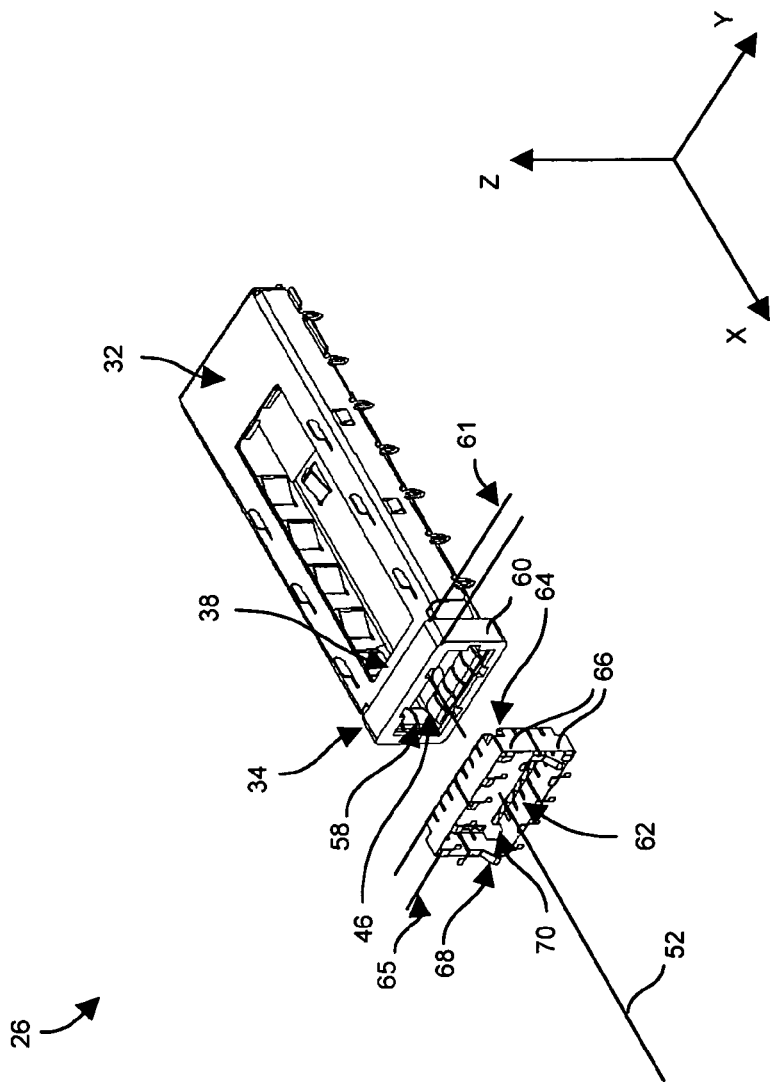
FIG. 2 is a more detailed view of the apparatus of FIG. 1.

FIG. 2 is a detailed view of the apparatus 26. The face plate 34 is shown already attached to the front portion 38 of the support member 28 (e.g., using a set of ramps on the support member 32, and grooves and tabs on the face plate 34). However, the EMI shielding clip 36 is shown detached from the face plate 34 to better illustrate particular details of the apparatus 26. With the face plate 34 attached to the front portion 38 of the support member 28, the face plate 34 secures a set of metallic leaf springs 58 around the opening 46 thus enabling the set of metallic leaf springs 58 to operate as an EMI gasket between the transceiver module 24 (FIG. 1) and the support member 28.

As shown in FIG. 2, the face plate 34 has four relatively uniform and deep edge portions 60 around the opening 46 of the support member 28. In some arrangements, the depth 61 of the four edge portions 60 is at least 0.125 inches measured in a direction along the insertion axis 52 (i.e., along the X-axis). Such depth provides enhanced EMI shielding around the opening 46.

As further shown in FIG. 2, the EMI shield clip 36 has a bezel side 62 and a finger side 64. Each side portion 48 of the EMI shielding clip 36 extends at a depth 65 along the insertion axis 52 (i.e., along the X-axis) which is longer than the edge portions 60 of the face plate 34, thus enabling the EMI shielding clip 36 to wrap around the face plate 34 in a 270 degree manner (also see FIG. 1). In such an installation position, the side portions 48 of the EMI shielding clip 36 extend around the edge portions 60 of the face plate 34 on three sides. Accordingly, the EMI shielding clip 36 provides contact to the bezel 30 directly from the outside skin of the support member (e.g., an XFP cage). As a result, the outside skin of the transceiver module 24 (FIG. 1) has direct contact to the grounding plane of the circuit board 22. Such connectivity provides a superior, positive ground path for EMI to travel through and be eliminated.

As shown in FIG. 2, each side portion 48 defines a pair of co-planar members 66, conductive members 68 and fingers 70. The conducting members 68 extend from the side portions 48 on the bezel side 62, and are configured to make robust electrical contact with the bezel 30 (FIG. 1). Similarly, the fingers 70 extend from the side portions on the finger side 64, and are configured to make robust electrical contact with the face plate 34 and the support member 32. As a result, there is significant electrical connectivity between the EMI shielding clip 36 and both the bezel 30 and the face plate 34 and the support member 32. Further details of the EMI shielding clip 36 will now be provided with reference to FIGS. 3 and 4.

Figure 3:
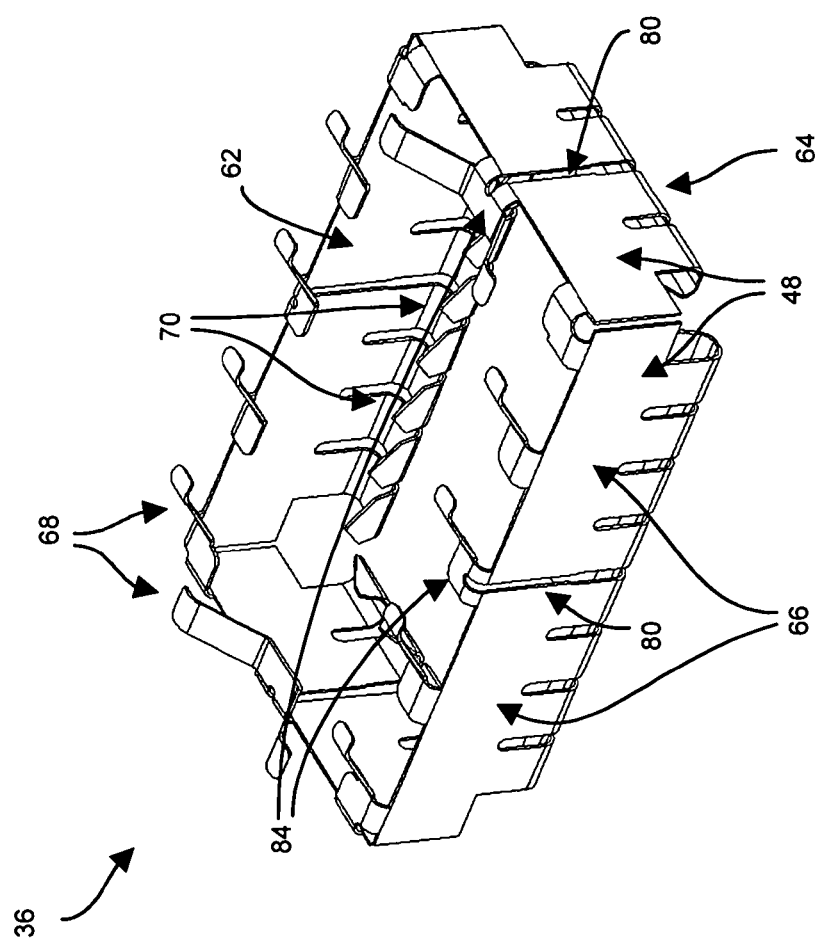
FIG. 3 is a perspective view of an EMI shielding clip of the apparatus of FIG. 2.
Figure 4:
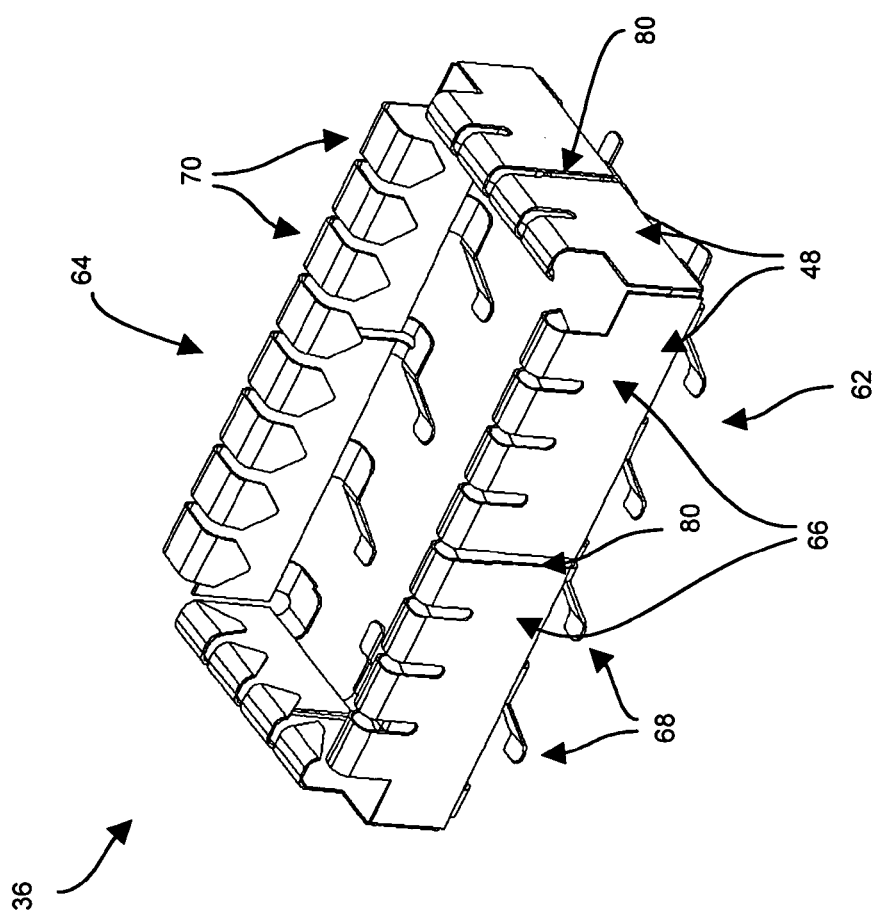
FIG. 4 is another perspective view of the EMI shielding clip but from an angle opposite to that of FIG. 3.

FIG. 3 is a perspective view of the EMI shielding clip 36 from a top angle, and FIG. 4 is another perspective view of the EMI shielding clip 36 but from a bottom angle. As shown in FIGS. 3 and 4, each side portion 48 of the EMI shielding clip 36 defines a gap 80 which separates that side portion 48 into the pair of co-planar edge sections 66 which are capable of moving relative to each other during hinge actuation. Tabs 84 on the bezel side 62 of the EMI shielding clip 36 connect the co-planar edge sections 66 of each side portion pair 48 together to form the hinges 50.

In order to actuate a hinge 50 defined by a side portion 48, the edge sections 66 of the side portion 48 splay away from each other at the finger side 64. As a result, the opening 46 defined by the EMI shielding clip 36 is capable of widening and thus fitting around the face plate 34 (also see FIGS. 1 and 2). Accordingly, the EMI shielding clip 36 does not permanently distort during installation but instead the fingers 70 easily comply and wrap around the face plate 34 on three sides (FIG. 1).

It should be understood that the above-described hinge design of the EMI shielding clip 36 enables the clip 36 to be a unitary member which is superior to a conglomeration of multiple conductive pieces since such a conglomeration of multiple conductive pieces would likely suffer from deficiencies including tolerance stack-up issues and gaps needed for proper assembly. Furthermore, a conglomeration of multiple conductive pieces would likely not be able to create an optimum or consistent grounding path. In contrast, the single piece design of the EMI shielding clip 36 reduces tolerance stackup and closes off the gap needed for assembly without affecting the form or fit of the clip's ability to seal off EMI leaks. Accordingly, the EMI shielding clip 36 reduces the costs of goods, reduces part count, and simplifies the assembly process.

As shown in FIGS. 3 and 4, each longer side portion 48 of the EMI shielding clip 36 defines eight fingers 70 (four fingers 70 per co-planar edge section 66). Additionally, each shorter side portion 48 of the EMI shielding clip 36 defines four fingers 70 (two fingers 70 per co-planar edge section 66). This arrangement of fingers 70 provides an advantageous balance of finger distribution for EMI shielding, and compliance that enables simply and efficient clip installation and manufacture. The tapered shape and angle of the fingers allows for sufficient electrical contact force without distorting the support member 32. In some arrangements, due to the compliance provided by the hinges 50 and the fingers 70, the EMI shield clip 36 is easily manufactured using standard brake tooling.

As described above, an EMI shielding clip 36 includes side portions 48 which define hinges 50 along mid-lines of the side portions 48 (see the gaps 80 in FIGS. 3 and 4). Actuation of the hinges 50 enables the clip 36 to easily install around a face plate 34 of a transceiver cage assembly while still allowing the clip 36 to be proportionately larger than conventional bezel EMI gaskets for XFP transceiver modules. As a result, the EMI shielding properties of such a clip are substantially superior to conventional bezel EMI gaskets. In particular, the EMI shielding features of the clip 36 are especially well-suited for operation as a key grounding component for high frequency devices, e.g., high frequency transceivers and modules running past 10 GHz.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A circuit board assembly, comprising:
   a circuit board;
   a transceiver module; and
   an apparatus configured to contain the transceiver module, the apparatus including:
      a support member defining a space to receive the transceiver module, the support member including a front portion which forms a front of the support member and a mounting portion which physically and electrically connects with the circuit board,
      a face plate which attaches to the front portion of the support member, the face plate defining an opening through which the transceiver module passes when the transceiver module enters and exits the space, and
      an electromagnetic interference shielding clip which installs around the face plate, the electromagnetic interference shielding clip including four side portions which define hinges along mid-lines of the side portions, actuation of the hinges defined by the four side portions of the electromagnetic interference shielding clip enabling the electromagnetic interference shielding clip to install around the face plate.

2. A circuit board assembly as in claim 1 wherein the transceiver module is configured to move through the opening along an insertion axis; and wherein the face plate includes four edge portions which define the opening, each edge portion having a depth of at least 0.125 inches measured in a direction along the insertion axis.

3. A circuit board assembly as in claim 2 wherein a gap divides each side portion into a pair of co-planar edge sections which move relative to each other during hinge actuation.

4. A circuit board assembly as in claim 3 wherein the circuit board includes a bezel; and wherein the co-planar edge sections of each pair of co-planar edge sections are connected by a tab which is configured to (i) operate as one of the hinges, and (ii) support a conductive member which is adapted to electrically interconnect the clip to a bezel of the circuit board.

5. A circuit board assembly as in claim 4 wherein the clip is formed from a single piece of metal stock and is configured to operate as an electromagnetic interference gasket between the bezel and the support member.

6. A circuit board assembly as in claim 2 wherein each side portion of the clip has a depth measured in the direction along the insertion axis, the depth of that side portion being longer than the depth of the edge portions of the face plate.

7. A circuit board assembly as in claim 6 wherein each side portion of the clip defines multiple fingers which are configured to wrap around three sides of the face plate.

8. A circuit board assembly as in claim 7 wherein each of two side portions of the clip define eight fingers; and wherein each of two other side portions of the clip define four fingers.

9. A circuit board assembly as in claim 2 wherein the depth of each edge portion of the face plate in the direction along the insertion axis is substantially uniform.

10. A circuit board assembly as in claim 9 wherein the clip is configured to extend around each edge portion of the face plate in a 270 degree manner.

11. An apparatus for containing a transceiver module, the apparatus comprising:
   a support member defining a space to receive the transceiver module, the support member including a front portion which forms a front of the support member and a mounting portion which is configured to physically and electrically connect with a circuit board;
   a face plate which attaches to the front portion of the support member, the face plate defining an opening through which the transceiver module passes when the transceiver module enters and exits the space; and
   an electromagnetic interference shielding clip which installs around the face plate, the electromagnetic interference shielding clip including four side portions which define hinges along mid-lines of the side portions, actuation of the hinges defined by the four side portions of the electromagnetic interference shielding clip enabling the electromagnetic interference shielding clip to install around the face plate.

12. An apparatus as in claim 11 wherein the transceiver module is configured to move through the opening along an insertion axis; and wherein the face plate includes four edge portions which define the opening, each edge portion having a depth of at least 0.125 inches measured in a direction along the insertion axis.

13. An apparatus as in claim 12 wherein a gap divides each side portion into a pair of co-planar edge sections which move relative to each other during hinge actuation.

14. An apparatus as in claim 13 wherein the co-planar edge sections of each pair of co-planar edge sections are connected by a tab which is configured to (i) operate as one of the hinges, and (ii) support a conductive member which is adapted to electrically interconnect the clip to a bezel of the circuit board.

15. An apparatus as in claim 14 wherein the clip is formed from a single piece of metal stock and is configured to operate as an electromagnetic interference gasket between the bezel and the support member.

16. An apparatus as in claim 12 wherein each side portion of the clip has a depth measured in the direction along the insertion axis, the depth of that side portion being longer than the depth of the edge portions of the face plate.

17. An apparatus as in claim 16 wherein each side portion of the clip defines multiple fingers which are configured to wrap around three sides of the face plate.

18. An apparatus as in claim 17 wherein each of two side portions of the clip define eight fingers; and wherein each of two other side portions of the clip define four fingers.

19. An apparatus as in claim 12 wherein the depth of each edge portion of the face plate in the direction along the insertion axis is substantially uniform.

20. An apparatus as in claim 19 wherein the clip is configured to extend around each edge portion of the face plate in a 270 degree manner.

21. An electromagnetic interference shielding clip for installing around a face plate which defines an opening through which a transceiver module passes when the transceiver module enters and exits a space, the electromagnetic interference shielding clip comprising:

four side portions which define hinges along mid-lines of the side portions, actuation of the hinges defined by the four side portions enabling the electromagnetic interference shielding clip to install around the face plate.

* * * * *